United States Patent
Powell et al.

(10) Patent No.: US 9,576,679 B2
(45) Date of Patent: Feb. 21, 2017

(54) MULTI-STAGE SAMPLE AND HOLD CIRCUIT

(71) Applicant: Silicon Laboratories Inc., Austin, TX (US)

(72) Inventors: Matthew R Powell, Austin, TX (US); Shouli Yan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/511,085

(22) Filed: Oct. 9, 2014

(65) Prior Publication Data

US 2016/0104543 A1 Apr. 14, 2016

(51) Int. Cl.
G11C 27/02 (2006.01)

(52) U.S. Cl.
CPC .......... G11C 27/026 (2013.01); G11C 27/02 (2013.01); G11C 27/024 (2013.01)

(58) Field of Classification Search
CPC ...... G11C 27/026; G11C 27/024; G11C 27/02
See application file for complete search history.

(56) References Cited

U.S. PATENT DOCUMENTS

| | | | |
|---|---|---|---|
| 4,535,300 A | 8/1985 | Streckmann | |
| 4,686,511 A | 8/1987 | Koen | |
| 5,162,670 A | 11/1992 | Itakura et al. | |
| 5,343,089 A | 8/1994 | Itakura et al. | |
| 6,668,028 B1 | 12/2003 | Wieck | |
| 7,298,010 B1* | 11/2007 | Ma | H01L 23/556 257/357 |
| 8,111,094 B2 | 2/2012 | Fischer | |
| 8,830,095 B2 | 9/2014 | Darthenay | |
| 2002/0167343 A1* | 11/2002 | Erhart | G11C 27/026 327/94 |
| 2010/0164551 A1* | 7/2010 | Pigott | G11C 27/02 327/94 |
| 2013/0210182 A1* | 8/2013 | Rothberg | C12Q 1/6874 438/49 |

OTHER PUBLICATIONS

Willis, Zero CVF Input Current Switched-Capacitor Instrumentation Amplifier, IEEE, 2005, Utah Design Center, American Fork, UT.
Ogawa, Transactions on Instrumentation and Measurement, IEEE, vol. 42, No. 4, Aug. 1993, Japan.
Yilmaz, A Switched Capacitor Subranging A/D Conversion Technique, Department of Electrical Engineering, Texas Tech University.

* cited by examiner

*Primary Examiner* — Jung Kim
(74) *Attorney, Agent, or Firm* — Cesari & Reed LLP; R. Michael Reed

(57) ABSTRACT

A circuit may include a first sample node configured to provide a low precision sample of an input signal, a second sample node configured to store a high precision sample of an input signal, and a first switch circuit coupled between an input and the first sample node. The circuit may further include a second switch circuit coupled between the first sample node and the second sample node and configured to limit leakage current that could discharge the second sample node.

16 Claims, 7 Drawing Sheets

MULTI-STAGE SAMPLE AND HOLD CIRCUIT

FIELD

The present disclosure is generally related to sample and hold circuits, and more particularly to multi-stage sample and hold circuits having low leakage.

BACKGROUND

Various operations performed by circuits may utilize sampled voltages. In some examples, a circuit may utilize a sample and hold circuit to sample a voltage and to hold the sampled voltage until the circuit can utilize the sampled voltage.

SUMMARY

In certain embodiments, a circuit may include a first sample node configured to provide a low precision sample of an input signal, a second sample node configured to store a high precision sample of an input signal, and a first switch circuit coupled between an input and the first sample node. The circuit further may include a second switch circuit including bulk material contact area, a first node coupled to the first sample node, a control node responsive to a control signal, and a second node coupled to the second sample node. The bulk material contact area may be configured to receive a voltage signal configured to reduce current leakage between the bulk material and at least one of the first node and the second node during a hold phase.

In other certain embodiments, a circuit may include a first node to provide a first sampled voltage, a second node to store a second sampled voltage having a higher precision than the first sampled voltage, and a first switch circuit coupled between an input and the first node. The circuit further may include a second switch circuit coupled between the first node and the second node. The second switch circuit may include at least one transistor having a drain coupled to the second node, a source coupled to the first node, a gate responsive to a control signal, and a bulk material contact location configured to receive a signal.

In still other certain embodiments, a circuit may include a sample capacitor coupled between a first node and a power supply and configured to store a first sample of an input signal. The circuit may include a second node to hold a second sample of the input signal and a switching circuit coupled between the first node and the second node. The switching circuit may be configured to couple the first node to the second node during a sample phase and to isolate the second node from the first node during a hold phase. The switching circuit may also be configured to limit leakage current from the second node through the switching circuit during the hold phase.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Figure 1:
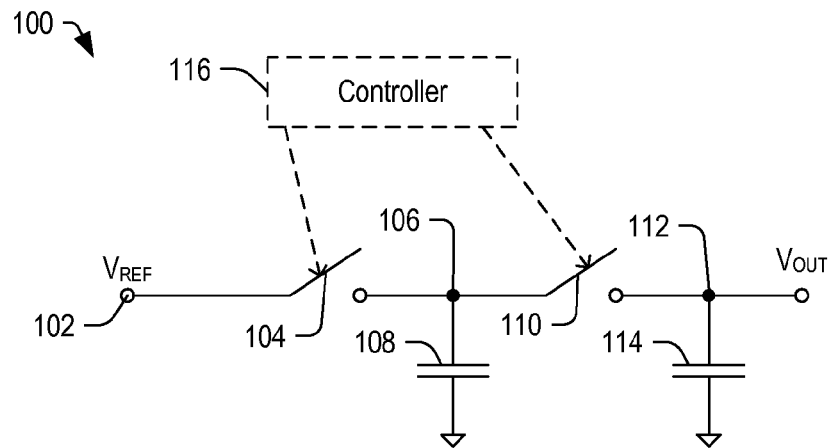
FIG. 1 is a diagram of a multi-stage sample and hold circuit according to certain embodiments.

In the following detailed description of embodiments, reference is made to the accompanying drawings which form a part hereof, and which are shown by way of illustrations. It is to be understood that features of various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may include a controller, such as a power management unit, microcontroller unit (MCU), logic circuitry, or any combination thereof, which may perform various operations in response to one or more software programs or processor-readable instructions. Dedicated hardware implementations including, but not limited to, application specific integrated circuits, programmable logic arrays, and other hardware devices can likewise be constructed to implement the methods and functions described herein.

Embodiments of circuits and methods are described below that may allow for performance of useful functions at a chip current level of microamperes or lower current levels. Embodiments of circuits and methods are described below that may sample and hold voltages, such as bias voltages, reference voltages, and input voltages, for extended periods of time. In certain embodiments, a circuit may include a switch topology having a reduced switch leakage and providing an average current consumption and capacitor area, which switch leakage and average current consumption may be less than that of a conventional sample and hold circuit. In certain embodiments, the topology may allow for extended periods of time between voltage refresh operations, which can consume high levels of current, because the low-leakage switch topology reduces current leakage, extending the hold time.

In certain embodiments, a circuit may sample two versions of an input signal, such as a voltage. A first sample may be stored at a relatively low precision node of the circuit, which node may experience current leakage and charge degradation, and a second sample may be stored at a relatively high precision node of the circuit, having relatively low leakage and longer hold time. In certain embodiments, a first switch, which may be implemented as a metal oxide semiconductor field effect transistor (MOSFET) or a bipolar junction transistor (BJT), may be selectively activated to couple an input to a first node, which may be coupled to a first capacitor. A second switch, which also may be implemented as a MOSFET or a BJT, may be selectively activated to couple the first node to a second node, which may be coupled to a second capacitor. The capacitors may be very high impedance elements that do not have appreciable leakage current. Further, an amplifier circuit may be configured to buffer a signal at the second node and to provide a buffered version of the signal to the first node, such that one side of the amplifier circuit may be coupled to a high precision version of a sampled signal and the other side of the amplifier circuit may be coupled to a lower precision version of the sampled voltage. Since leakage current may be related to a voltage difference between the first and second nodes divided by resistance, since the two nodes store a sampled version of the same voltage, the voltage differential is small, and thus the leakage current may be small. Further, in certain embodiments, the bulk material may be charge-coupled to the source of the MOSFET or may receive an injected charge, which may reduce leakage current through the P-N junctions of the MOSFET.

In the following discussion, the switches may be described as being implemented as MOSFET devices. However, it should be appreciated that, in certain embodiments, the switches may be implemented using bipolar junction devices, such as bipolar junction transistors, without departing from the disclosure. One possible example of a circuit that may be configured to perform a sample and hold operation is described below with respect to FIG. 1.

FIG. 1 is a diagram of a multi-stage sample and hold circuit 100 according to certain embodiments. The circuit 100 may include a node 102 configured to receive a signal, such as a reference voltage ($V_{REF}$). The node 102 may be selectively coupled to a node 106 through a switch 104. The node 106 may be coupled to a capacitor 108 having a plate coupled to the node 106 and a second plate coupled to a power supply terminal, such as ground. The node 106 may also be coupled to a node 112 through a switch 110. The node 112 may be coupled to a capacitor 114 having a plate coupled to the node 112 and a second plate coupled to a power supply terminal, such as ground. The node 112 may also be coupled to an output to provide an output signal, such as an output voltage ($V_{OUT}$). The circuit 100 may also include a controller 116 (or may be coupled to the controller 116), which may provide control signals to control operation of the switches 104 and 110. In certain embodiments, the controller 116 may include a power management unit, a microcontroller unit (MCU), logic circuitry, application specific integrated circuits, programmable logic arrays, other hardware devices, other circuitry, or any combination thereof.

In certain embodiments, during a sample period, the switch 104 may be closed to sample a signal from the node 102 onto the capacitor 108, and the switch 110 may be closed to sample the signal from the node 102 onto the capacitor 114. During a second period, such as a hold period, the switches 104 and 110 may be open, isolating the node 102 from the output 114 and isolating the relatively high precision, low-leakage voltage at node 112 from the relatively low precision voltage at node 106.

In certain embodiments, the switches 104 and 110 may be implemented as transistor circuits configured to provide a sample and hold functionality. An example of a transistor implementation of a circuit configured to sample and hold a reference voltage is described below with respect to FIG. 2.

Figure 2:
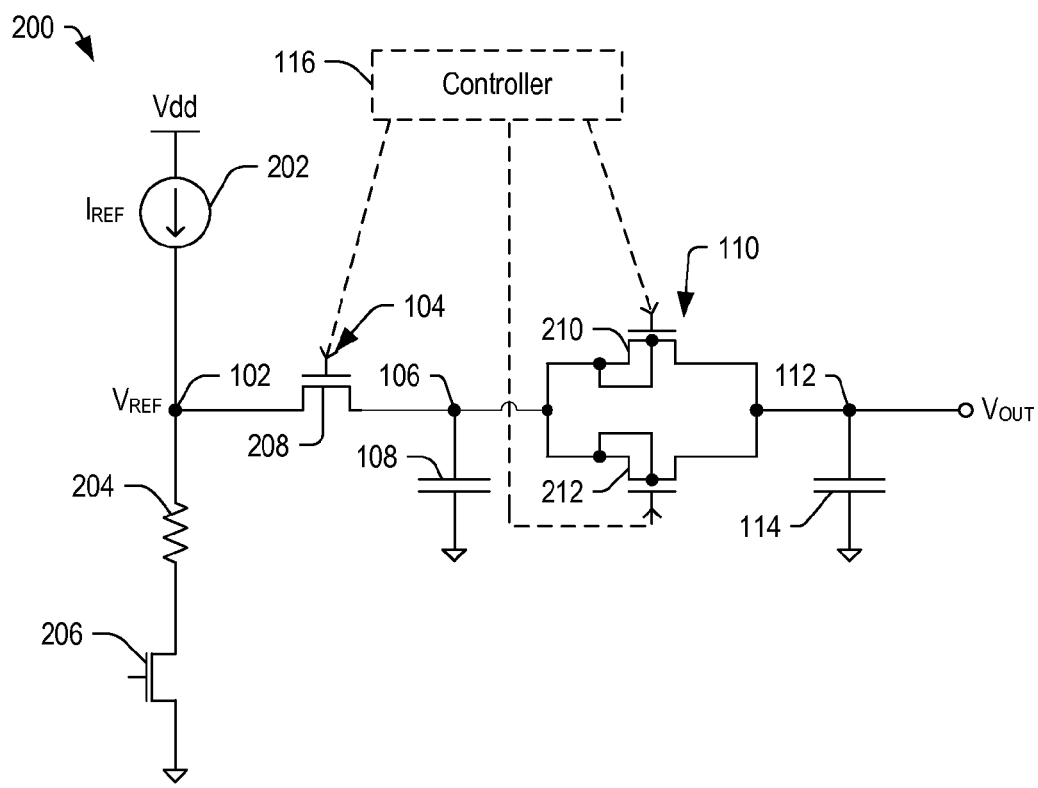
FIG. 2 is a diagram of a multi-stage sample and hold circuit according to certain embodiments.

FIG. 2 is a diagram of a multi-stage sample and hold circuit 200 according to certain embodiments. The sample and hold circuit 200 may be one possible implementation of the sample and hold circuit 100 of FIG. 1. The sample and hold circuit 200 may include a current source 202 between a power supply terminal (Vdd) and a node 102. The sample and hold circuit 200 may further include a resistor 204 coupled between the node 102 and a transistor 206, which may include a drain coupled to the resistor 204, a gate, and a source couple to a power supply terminal, such as ground.

The sample and hold circuit 200 may include a switch 104 coupled between the node 102 and the node 106. In certain embodiments, the switch 104 may be implemented as a MOSFET 208 including a source, a drain, and a gate. The gate of the MOSFET 208 may be coupled to the controller 116 to receive control signals. As explained below, the MOSFET 208 may be a PMOS or an NMOS transistor, depending on the implementation. The sample and hold circuit 200 may further include the capacitor 108 coupled between the node 106 and the power supply terminal, such as ground. Additionally, the sample and hold circuit 200 may include a switch 110 coupled between the node 106 and the node 112. The switch 110 may include a pair of transistors 210 and 212 coupled in parallel between the nodes 106 and 112. In certain embodiments, the switch 110 may include a first transistor 210 having a source coupled to the node 106 and to the bulk material, a gate, and a drain coupled to the node 112. The switch 110 may also include a second transistor 212 having a source coupled to the node 106 and to the bulk material, a gate, and a drain coupled to the node 112. The sample and hold circuit 200 may include the capacitor 114 coupled between the node 112 and the power supply terminal, such as ground. The node 112 may be coupled to an output to provide an output voltage ($V_{OUT}$). In the illustrated example, the node 112 may provide a high precision version of the sample signal, while the node 106 may provide a lower precision version of the sampled signal.

In certain embodiments, the switches 104 and 110 may be implemented in a CMOS process, using PMOS transistors, NMOS transistors, or any combination thereof. In certain embodiments, the transistors may include a gate, a drain, a source, and bulk material. In the illustrated examples, the drains and sources may be interchangeable. In certain embodiments, the transistors may include a collector, a base, and an emitter, and may include bulk material. In an NMOS transistor example, the drains of transistors 210 and 212 may be coupled to the high precision version of the sampled signal at node 112. The sources of transistors 210 and 212 may be coupled to the lower precision version of the sampled signal at node 106. When the sampled voltage from node 102 is being refreshed (i.e., the capacitors 108 and 114 are being recharged), the gate voltages of transistors 208, 210 and 212 are driven high and the impedance from source to drain is low (i.e., the switches 104 and 110 are closed). When the sampled voltage is being held (the sampled charge is stored by capacitors 108 and 114), the gate voltages of transistors 208, 210, and 212 are driven low, and the source-to-drain impedance is high (i.e., the switches 104 and 110 are open). A PMOS transistor implementation is similar except that the high impedance (closed) case exists when the gate voltage is low and low impedance (open) case is when the gate voltage is high. A switch circuit may be implemented by an NMOS transistor, a PMOS transistor, or a combination thereof. Further, the transistor implementation may be determined based on the range of voltage potentials for sampled voltages as compared to the gate control voltages available to the PMOS transistors and the NMOS transistors, as well as the desired impedance for the closed switch during refresh operations.

Depending on the process technology, device specifics and sampled voltages, there may be very little current flow from source to drain when the switches 104 and 110 are closed. However, there is a diode (a P-N junction) between the bulk material and the high-precision sampled voltage attached to the drain. In certain embodiments, the bulk material of an NMOS transistor may be coupled to a lower voltage potential, such as ground or VSS, and the bulk material of a PMOS transistor may be coupled to a higher voltage potential, such as VDD or a power supply. As long as GND or VSS is a lower voltage than sampled voltage, and VDD or the power supply voltage is greater than sampled voltage, the diode junction between the gate and the bulk material is reverse biased and does not conduct much current.

In certain embodiments, the bulk material of both PMOS transistors and NMOS transistors (whichever are used for a particular switch) may be coupled to the source of those transistors (the lower precision version of the sampled signal at node 106). This coupling may reduce the voltage difference between the bulk material and the drain of the transistor, reducing the diode leakage by reducing the voltage difference across the PN junctions within the transistor to a few millivolts, which may be less than the threshold voltage.

The switch 104 may be implemented in a variety of switch topologies depending on the circuit need. Since the switch 110 provides relatively low leakage, greater leakage can be tolerated in the switch 104 since the node 106 may have relatively low precision without sacrificing accuracy of the sample and hold circuit 200.

In certain embodiments, the node 112 represents a relatively high precision node, while the node 106 represents a relatively low precision node. The transistors 210 and 212 have their bulk materials shorted to the node 106. The transistor 210 has a drain coupled to the node 112, a source coupled to the node 106, and a gate. The transistor 212 has a drain coupled to the node 112, a source coupled to the node 106, and a gate. The transistors 210 and 212 may be controlled by a control signal (or more than one control signal) from the controller 116.

In certain embodiments, during a sample phase, signals may be applied to the gates of transistors 206, 208, 210, and 212 to enable current flow. A current, such as reference current ($I_{REF}$), may be driven into the resistor 204, generating a reference voltage ($V_{REF}$) at node 102. This reference voltage may be sampled on the capacitor 108 via the node 106 and on the capacitor 114 via the node 112. During a hold phase, the transistors 206, 208, 210, and 212 may be switched off (by applying suitable signals to their respective gates). In certain embodiments, any sampling scheme configured to generate a sampled voltage on a node can be improved by adding the switch 110 (transistors 210 and 212) and sampling the signal onto the node 112 instead.

While the embodiments described with respect to FIGS. 1 and 2 include a pair of capacitors, it is also possible to omit one of the capacitors and to bias the lower precision sampled voltage at the node 106 with a buffered version of the higher precision voltage. In FIGS. 1 and 2, a controller 116 is shown in phantom because the controller 116 may be part of the circuit 100 or 200 or may be external, depending on the implementation. In the following discussion, the controller is not shown, but it should be appreciated that the switching circuitry may be coupled to the controller 116 to receive control signals that control switch timing in order to perform sample and hold operations. An example of a sample and hold circuit that utilizes a buffer circuit is described below with respect to FIG. 3.

Figure 3:
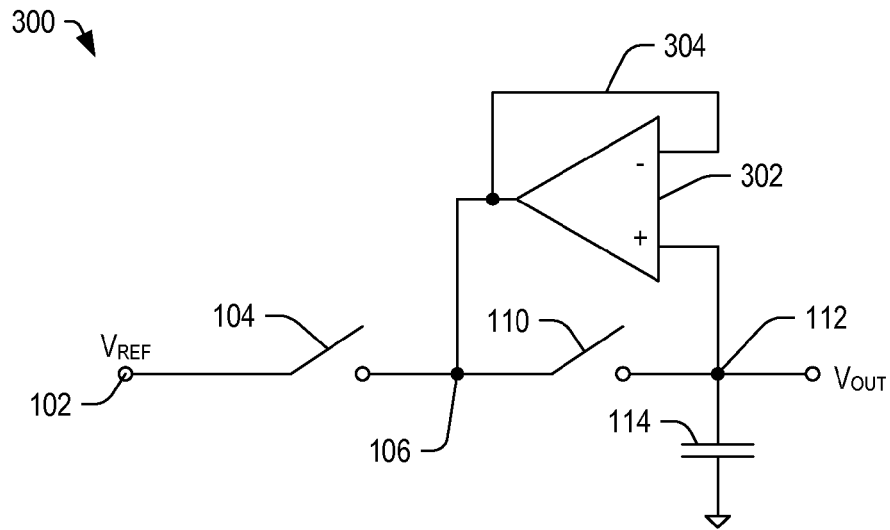
FIG. 3 is a diagram of a multi-stage sample and hold circuit including a buffer circuit according to certain embodiments.

FIG. 3 is a diagram of a multi-stage sample and hold circuit 300 including a buffer circuit according to certain embodiments. The sample and hold circuit 300 may include all of the elements of the sample and hold circuit 100 in FIG. 1, except that the capacitor 108 may be omitted. The sample and hold circuit 300 further may include an amplifier 302 including a first input coupled to the node 112, an output coupled to the node 106, and a second input coupled to the node 106 via a feedback loop 304.

In certain embodiments, during a sample phase, the transistors 206, 208, 210 and 212 may be biased to conduct current. A current ($I_{REF}$) may be applied to resistor 204, producing a reference voltage ($V_{REF}$), which may be sampled onto nodes 106 and 112. During a hold phase, the transistors 206, 208, 210, and 210 may be biased in an off state. The amplifier 302 may provide an output signal to the node 106 that may be approximately equal to a charge stored by the capacitor 114. The amplifier 302 may bias the lower precision sampled voltage at the node 106 with a buffered version of the higher precision voltage from the node 112. In certain embodiments, the amplifier 302 may be implemented as a nanoampere-level buffer, which may take very little die area. Further, by omitting the capacitor 108, circuit real estate may be conserved. Moreover, the omission of the capacitor 108 may reduce the settle time for the circuit, by reducing the amount of settling due to the capacitance with each refresh (sample) cycle. Further, if a lot of leakage is expected on the node 106, the circuit configuration that includes the amplifier 302 may reduce overall power consumption.

The switch configuration described above with respect to FIG. 3 may be implemented using complementary metal oxide semiconductor (CMOS) technology. An example of a sample and hold circuit implemented in CMOS technology and including a buffer circuit (implemented as an amplifier) is described below with respect to FIG. 4.

Figure 4:
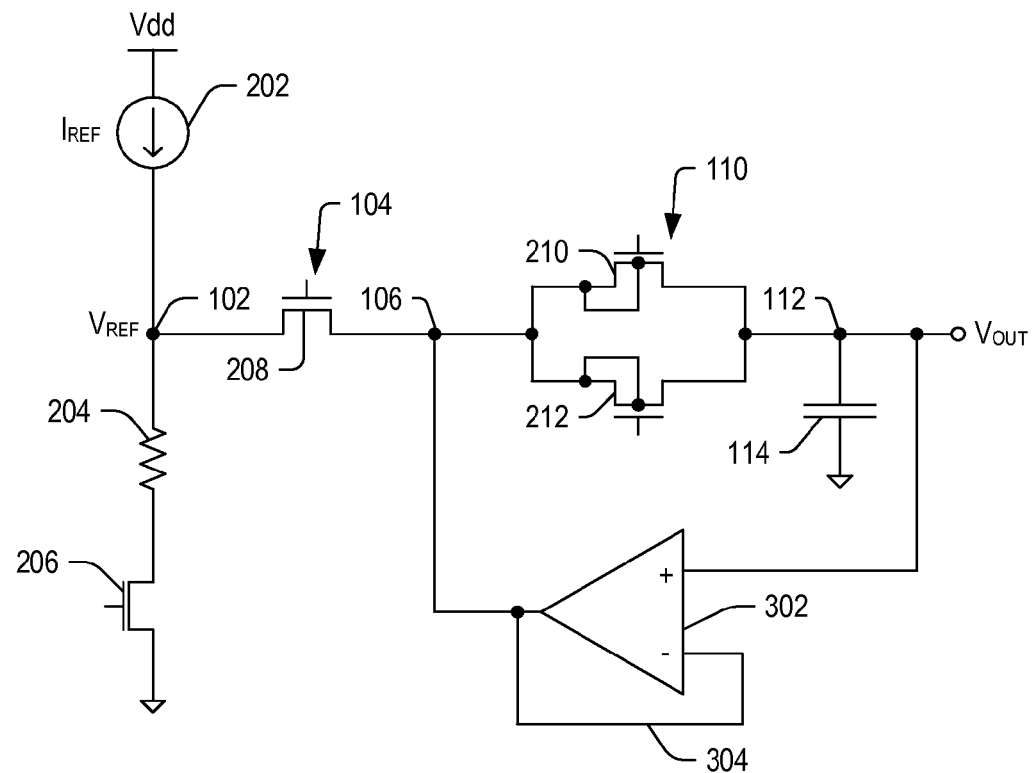
FIG. 4 is a diagram of a multi-stage sample and hold circuit including a buffer circuit according to certain embodiments.

FIG. 4 is a diagram of a multi-stage sample and hold circuit 400 including a buffer circuit according to certain embodiments. The sample and hold circuit 400 may include all of the elements of the sample and hold circuit 200, except that the capacitor 108 may be omitted. The sample and hold circuit 400 may include the amplifier 302 having a first input coupled to the node 112, an output coupled to the node 106, and a feedback loop 304 coupled between the node 106 and a second input of the amplifier 302.

In certain embodiments, during a sample phase, the transistors 206, 208, 210 and 212 may be biased to conduct current. A current, such as a reference current ($I_{REF}$), may be applied to resistor 204, producing a reference voltage ($V_{REF}$), which may be sampled onto nodes 106 and 112. During a hold phase, the transistors 206, 208, 210, and 210 may be biased in an off state. The amplifier 302 may provide an output signal to the node 106 that may be approximately equal to a charge stored by the capacitor 114. The amplifier 302 may bias the lower precision sampled voltage at the node 106 with a buffered version of the higher precision voltage from the node 112.

In certain embodiments, such as embodiments where the sampled voltage may change over time or where the voltage to be sampled is a supply voltage, it may be desirable to sample a voltage from a voltage-divider circuit (i.e., to sample a divided version of another signal. An example of such a circuit is described below with respect to FIG. 5.

Figure 5:
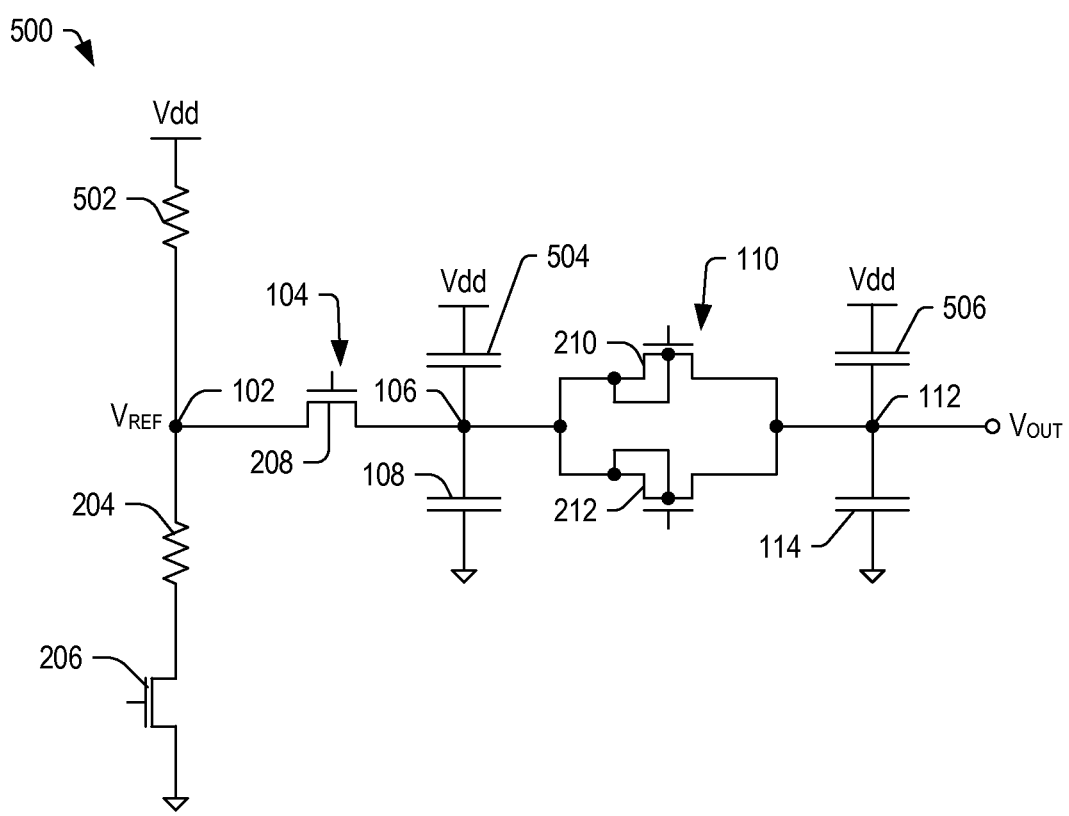
FIG. 5 is a diagram of a multi-stage sample and hold circuit including a capacitor circuit defining a capacitor ratio selected to match a ratio of a voltage divider circuit according to certain embodiments.

FIG. 5 is a diagram of a multi-stage sample and hold circuit 500 including a capacitor circuit defining a capacitor ratio selected to match a ratio of a voltage divider circuit according to certain embodiments. The sample and hold circuit 500 may include all of the elements of the sample and hold circuit of FIG. 2. Further, the sample and hold circuit 500 may include a resistor 502 coupled between the power supply (Vdd) and the node 102. Additionally, the sample and hold circuit 500 may include a capacitor 504 coupled between a power supply (Vdd) and the node 106, and may include a capacitor 506 coupled between a power supply (Vdd) and the node 112.

In certain embodiments, during a sample phase, the transistors 206, 208, 210, and 212 may be biased to conduct current. The resistors 502 and 204 may cooperate to provide a voltage divider circuit to produce a divided voltage ($V_{REF}$) at the node 102. The divided voltage ($V_{REF}$) may be provided to the nodes 106 and 112. In certain embodiments, the capacitive ratio of capacitors 504 and 108 may be chosen to substantially match a resistive ratio of the resistors 504 and 204, causing the sampled voltage at the node 106 to substantially track the supply voltage (Vdd), divided by the fixed ratio. Similarly, the capacitive ratio of the capacitors 506 and 114 may be chosen to substantially match a resistive ratio of the resistors 504 and 204, causing the sampled voltage at the node 112 to substantially track the supply voltage (Vdd), divided by the fixed ratio.

In the embodiment of FIG. 5, the sampled voltage may vary over time, and the sample and hold circuit 500 may capture samples at the node 112 that substantially track the supply voltage (Vdd) (or some other voltage to be monitored). The sample and hold circuit 500 may be used to monitor a divided down version of a selected signal. In certain embodiments, the sample and hold circuit 500 may be used to monitor a supply voltage (Vdd), which can be difficult to monitor directly. If the ratio of the pair of sampling capacitors 504 and 108 and the pair of sampling capacitors 506 and 114 is properly chosen to match the resistor ratio of resistors 502 and 204, the sampled voltage at the node 112 may track the supply voltage, Vdd, divided by the fixed ratio. During the hold phase, the transistors 206, 208, 210, and 212 may be biased in an off state. By coupling the bulk material of the transistors 210 and 212 to the node 106, the voltage differential across the P-N junctions may be less than the threshold voltage for the P-N junction diode to conduct. Accordingly, the node 112 may maintain a higher precision sample than the node 106 because the node 106 may experience more leakage because the bulk material of the transistor 208 may not be coupled to the node 102.

In certain embodiments, though it may be desirable to refresh the sampled voltage at the node 112 occasionally through the resistor divider circuit (resistors 504 and 204) to correct for leakage-related drift, the bootstrapping provided by coupling the bulk material of the transistors 210 and 212 to the node 106 may substantially reduce the refresh frequency by reducing leakage.

In certain embodiments, it may be desirable to reduce leakage further for higher precision over a longer period. For example, in nanoampere implementations, it may be desirable to maintain a bias voltage at the node 102 to reduce leakage through the switch 104 by reducing the drain-to-source voltage differential across the transistors. An example of a circuit configured to reduce leakage through the switch 104 is described below with respect to FIG. 6.

Figure 6:
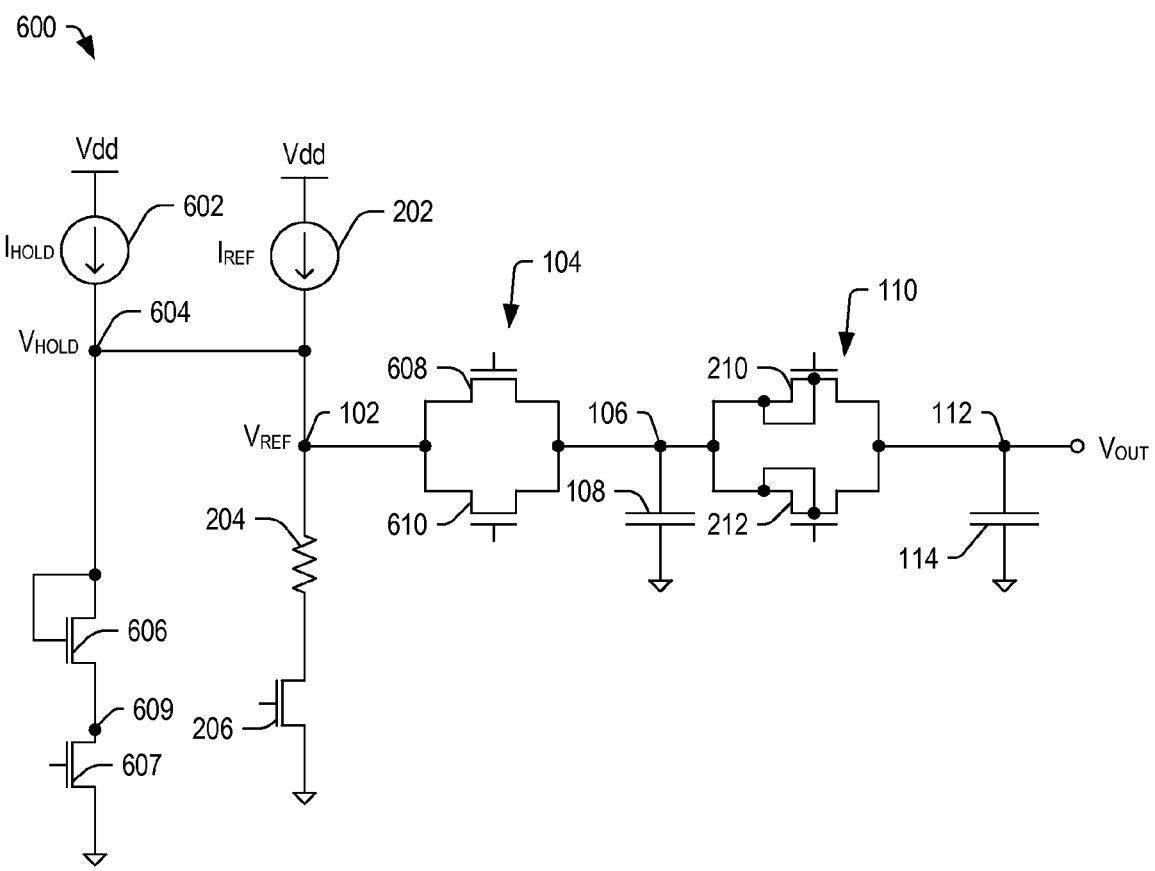
FIG. 6 is a diagram of a multi-stage sample and hold circuit including a bias voltage circuit according to certain embodiments.

FIG. 6 is a diagram of a multi-stage sample and hold circuit 600 including a bias voltage circuit according to certain embodiments. The sample and hold circuit 600 may include all of the elements of the sample and hold circuit 200 of FIG. 2, except that the transistor 208 is replaced with a pair of transistors 608 and 610 coupled in parallel between the node 102 and the node 106. Additionally, the sample and hold circuit 600 may include a hold circuit including a current source 602 coupled between a supply voltage (Vdd) and a node 604, which is coupled to the node 102. The sample and hold circuit 600 further may include a transistor 606, which is diode connected and coupled between the node 604 and a node 609, which may be coupled to a power supply, such as ground, via a transistor 607. The transistor 606 may include a drain coupled to the node 604, a gate coupled to the drain, and a source coupled to the node 609. The transistor 607 may include a drain coupled to the node 609, a gate configured to receive a control signal ($V_{HOLD}$), and a source coupled to the power supply.

In certain embodiments, during a sample phase, the transistors 608, 610, 206, 210, and 212 may be biased to conduct current, and the transistor 607 may be biased to decouple the node 609 from the power supply. In certain embodiments, the current source 602 may also be deactivated during the sample phase. The voltage at the node 102 may be sampled onto the nodes 106 and 112, which voltage may be stored by capacitors 108 and 114, respectively. During a hold phase, the transistors 206, 608, 610, 210, and 212 may be biased in an off state, the transistor 607 may be biased to conduct current, and the current source 602 may be activated to provide a current to the diode-connected transistor 606, producing a voltage at the node 604 that is approximately a threshold voltage drop above ground. Further, in the hold phase, the transistor 607 may be biased to couple the node 609 to the supply voltage.

By biasing the node 102 to a threshold voltage level during a hold phase, the drain-source voltage differential across the transistors 608 and 610 is reduced, thereby reducing leakage current through the transistors 608 and 610. In certain embodiments, the bulk material of the transistors 608 and 610 may also be coupled to the node 102 to further reduce leakage.

In certain embodiments, the current source 602 may sink a nanoampere current across the diode-connected transistor 606 to produce a hold voltage ($V_{HOLD}$) at the node 604. By turning off the transistors 206, 608, 610, 210, and 212, current flow to ground and current flow to the output at the node 112 is reduced. Further, the low current provided by the current source 602 may reduce the overall power consumption of the circuit as compared to the leakage that may otherwise drain the charge during the hold phase, resulting in higher frequency recharge of the sampled voltages.

In certain embodiments, by producing two sampled voltages at different levels of precision, a relatively low precision sample may be used to enhance the precision of the high precision sample by reducing leakage from the high precision node. In certain embodiments, multiple separate lower precision sampled voltages may be used to provide stages of bootstrap protection for a high precision sampled voltage. In circuits where the sampled voltage can be driven from multiple possible sources with separate switch paths, the multiple separate lower precision sampled voltages coupled with the higher precision sampled voltages may be particularly useful. An example of a circuit including multiple lower precision sampled voltages is described below with respect to FIG. 7.

Figure 7:
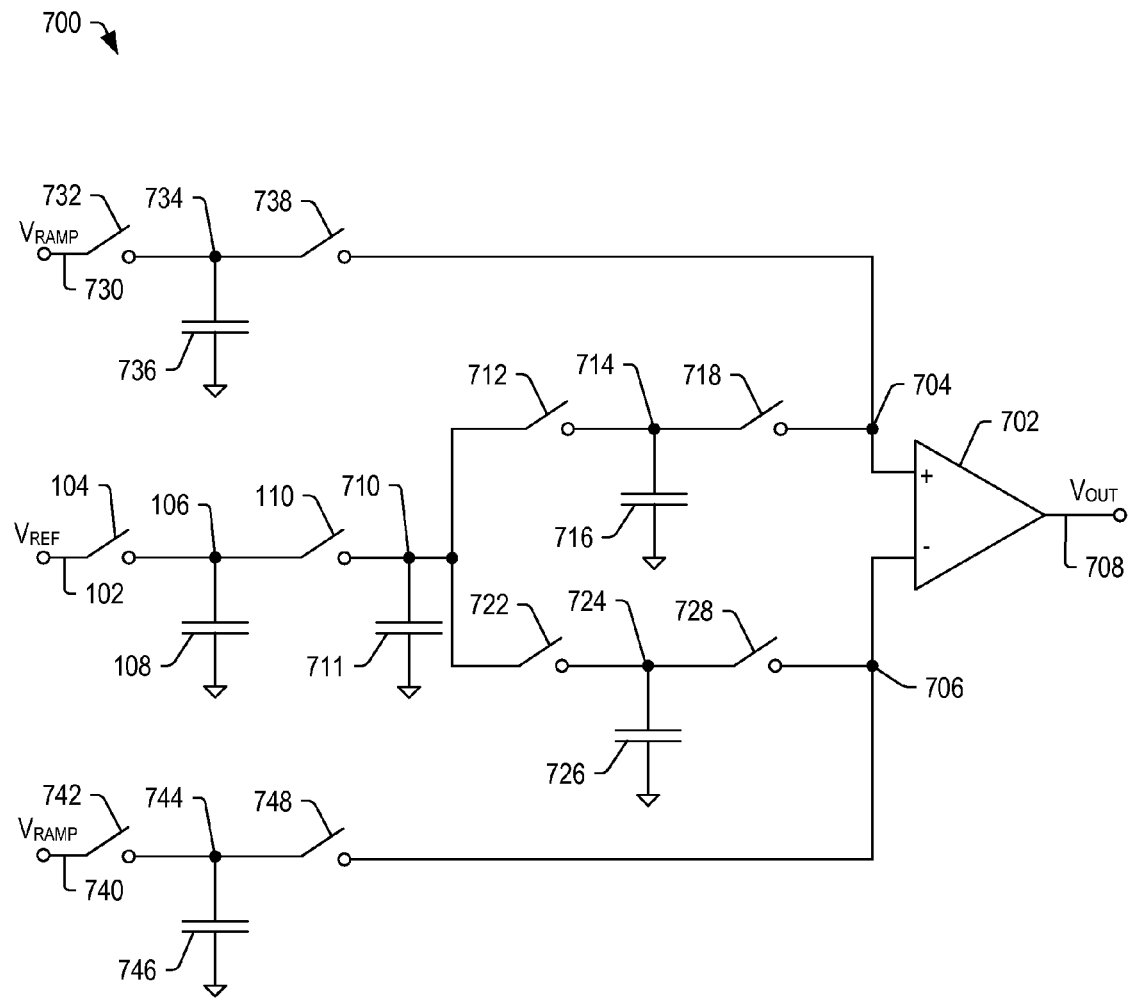
FIG. 7 is a diagram of a multi-stage sample and hold circuit configurable to perform a chop operation according to certain embodiments.

FIG. 7 is a diagram of a multi-stage sample and hold circuit 700 configurable to perform a chop operation according to certain embodiments. The sample and hold circuit 700 may include an amplifier 702 having a first input coupled to a node 704, a second output coupled to a node 706, and an output coupled to a node 708, which may provide an output voltage ($V_{OUT}$). The sample and hold circuit 700 may include the switch 104 coupled between the node 102 and the node 106, and may include the capacitor 108 coupled between the node 106 and a power supply, such as ground. The sample and hold circuit 700 may also include the switch 110 coupled between the node 104 and a node 710. The sample and hold circuit 700 may further include a capacitor 711 coupled between the node 710 and a power supply, such as ground. The sample and hold circuit 700 may also include a switch 712 coupled between the node 710 and a node 714, and may include a capacitor 716 coupled between the node 714 and a supply voltage, such as ground. The sample and hold circuit 700 also may include a switch 718 coupled between the node 714 and the node 704. The sample and hold circuit 700 may further include a switch 722 coupled between the node 710 and a node 724, and may include a capacitor 726 coupled between the node 724 and a supply voltage, such as ground. The sample and hold circuit 700 may further include a switch 728 coupled between the node 724 and the node 706.

The sample and hold circuit 700 may further include a switch 732 coupled between a node 730 and a node 734. The sample and hold circuit 700 may further include a capacitor 736 coupled between the node 734 and a power supply, such as ground. The sample and hold circuit 700 may also include a switch 738 coupled between the node 734 and the node 704.

The sample and hold circuit 700 may further include a switch 742 coupled between a node 740 and a node 744. The sample and hold circuit 700 may further include a capacitor 746 coupled between the node 744 and a power supply, such as ground. The sample and hold circuit 700 may also include a switch 748 coupled between the node 744 and the node 704.

In certain embodiments, the sample and hold circuit 700 may be configured to implement a chop operation, which may operate to cancel component mismatch-induced errors over time. In an example, the voltage ($V_{REF}$) may be sampled and held, and the voltage ($V_{RAMP}$) can be generated and used. In certain embodiments, the voltage ($V_{RAMP}$) may be a signal received at an input from a pad or a ramp voltage from a very low power/low frequency resistor/capacitor (RC) oscillator.

In certain embodiments, in one chop state, sampling may be performed by turning on switches 104, 110, 712, 718, 738 and 722. Monitoring of the ramp voltage ($V_{RAMP}$) may be achieved by turning on switches 742 and 748. The reference voltage ($V_{REF}$) may be sampled on capacitors 108, 711, 716, 726 and 736, while the switches 728 and 732 are off. In the hold mode, the switches 104, 110, 738 and 722 are turned off, and the switches 712, 718, 742 and 748 remain on. The high precision sampled voltage exists on the nodes 710, 714 and 704.

In the other chop state, sampling may be done by turning on the switches 104, 110, 722, 728, 748 and 712. The reference voltage ($V_{REF}$) is sampled onto capacitors 108, 711, 716, 726 and 746. Monitoring of the ramp voltage ($V_{RAMP}$) is achieved by turning on the switches 732 and 738, while the switches 742 and 718 are turned off. In the hold mode, the switches 104, 110, 748 and 712 are turned off and the switches 722, 728, 732 and 738 remain on. The high precision voltage exists on the nodes 710, 724 and 706.

The sample and hold circuit 700 utilizes multiple separate lower-precision sampled voltages (via nodes 106, 734, and 744) to provide stages of bootstrap protection for the higher precision sampled voltage (via nodes 710, 714 and 724). The switched output stage may be driven from multiple possible sources with separate switch paths.

In the above-discussion of FIGS. 1-7, the circuit may receive a reference voltage ($V_{REF}$). It should be understood that the reference voltage in the above-discussion refers to a signal of interest in the system, and may be a signal other than a reference signal. Further, in the above-discussion of FIGS. 1-7, the bulk-source coupling and charge injection has been mentioned. Embodiments of MOSFETs that include a bulk contact for facilitating such electrical connects are described below with respect to FIGS. 8 and 9.

Figure 8:
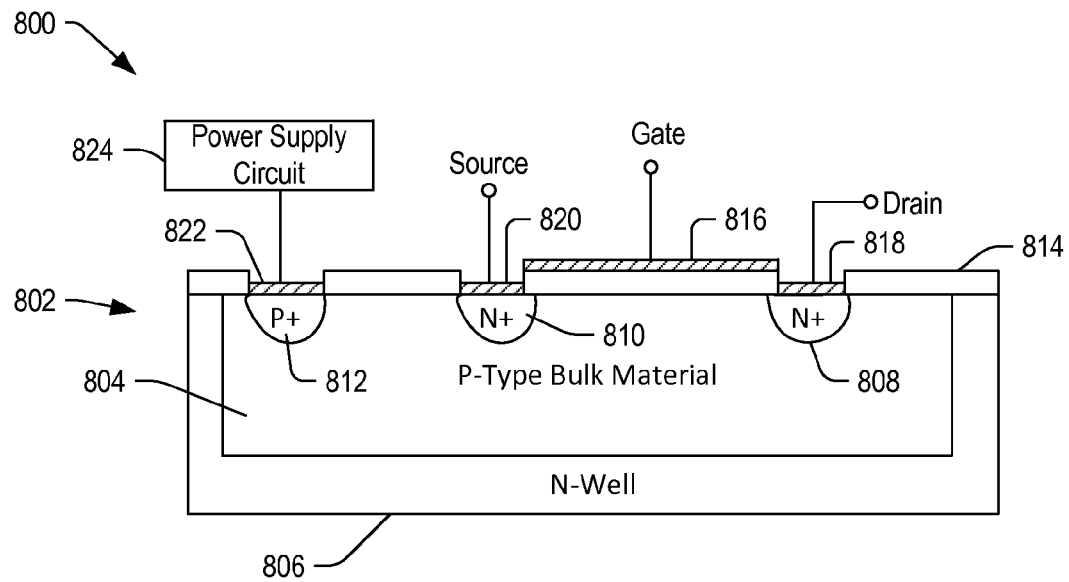
FIG. 8 is a cross-sectional diagram of an n-channel field effect transistor circuit including an electrical contact configured to couple the bulk material to a power supply according to certain embodiments.

FIG. 8 is a cross-sectional diagram of an n-channel metal oxide semiconductor field effect transistor (MOSFET) circuit 800 including an electrical contact configured to couple the bulk material to a power supply according to certain embodiments. The MOSFET 800 may include a substrate 802 including p-type bulk material 804 surrounded by an n-well 806. The substrate 802 may include two n+ diffusion regions 808 and 810 corresponding to drain and source regions of the MOSFET circuit 800. Further, the substrate 802 may include a p+ diffusion area 812, which may correspond to a connection area for coupling to the bulk material 804. The substrate 802 may further include a field oxide layer 814, which may be etched in selected areas to allow for formation of contacts.

The MOSFET circuit 800 may include a drain contact 818 proximate to the n+ diffusion region 808, and may include a gate contact 816 spaced apart from and extending between the n+ diffusion region 808 and the n+ diffusion region 810. The n+ diffusion region 810 may have a corresponding source contact 820. Further, the MOSFET 800 may include a bulk contact 822, which may be proximate to the p+ diffusion area 812. In the illustrated example, the bulk contact 822 may be coupled to a power supply circuit 824, which may be a power management unit, a switched supply, a voltage regulator, a signal generator, or other controllable voltage source, to receive a signal, such as a power supply, a reference voltage, or some other voltage signal.

In certain embodiments, the P-N junctions define intrinsic diodes within the MOSFET. In certain embodiments, by applying a voltage to the bulk material 804 through the bulk contact 822 and the p+ diffusion area 812, a differential voltage across the parasitic diode between the P-N junctions may be reduced. By reducing the differential voltage across the junction, current leakage through the P-N junctions may be reduced. It should be appreciated that the bulk voltage bias may also be utilized in a P-channel MOSFET device.

Figure 9:
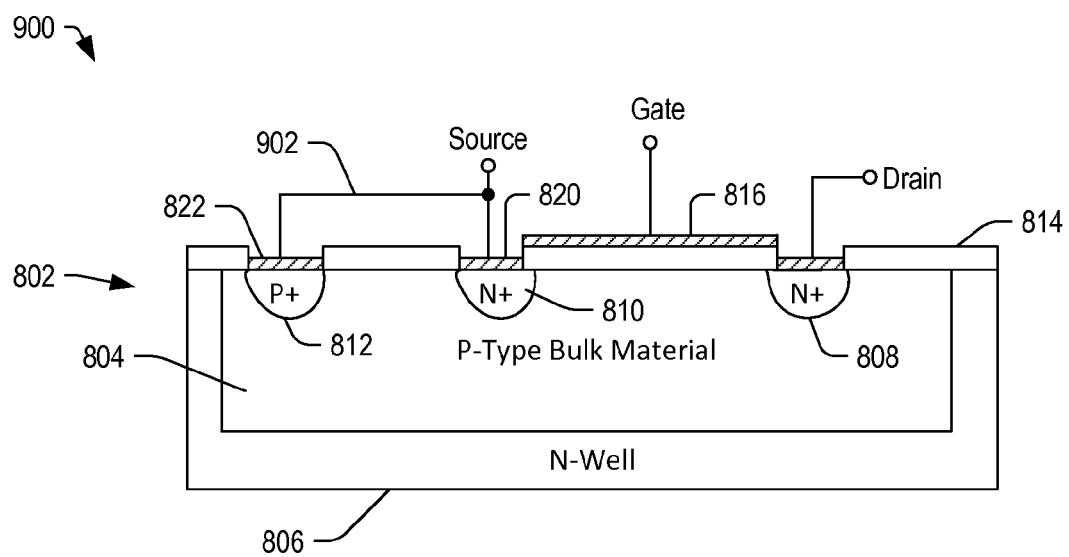
FIG. 9 is a cross-sectional diagram of an n-channel field effect transistor circuit including an electrical contact configured to couple the bulk material to a source according to certain embodiments.

FIG. 9 is a cross-sectional diagram of an n-channel MOSFET circuit 900 including an electrical contact configured to couple the bulk material to a source according to certain embodiments. The MOSFET 900 may include all of the elements of the MOSFET circuit 800 in FIG. 8, except that the connection between the bulk contact 822 and a power supply circuit 824 may be omitted. In certain embodiments, the MOSFET circuit 900 may include an electrical coupling between the source contact 820 and the bulk contact 822. By coupling the source to the bulk material, the differential voltage across the P-N junctions may be reduced, thereby reducing current leakage from the drain to the bulk material.

While the embodiments described in FIGS. 8 and 9 have depicted two possible examples of circuits that make it possible to set a voltage potential on the source and bulk material, other different mechanisms, structures, and methods may also be applied to set the potential on the source and bulk to reduce current leakage from the drain to the bulk material. In some embodiments, a variety of structures or methods may be used to increase the voltage potential of the bulk material and the source to a potential that is close to that of the drain to achieve the reduced leakage current effect.

Figure 10:
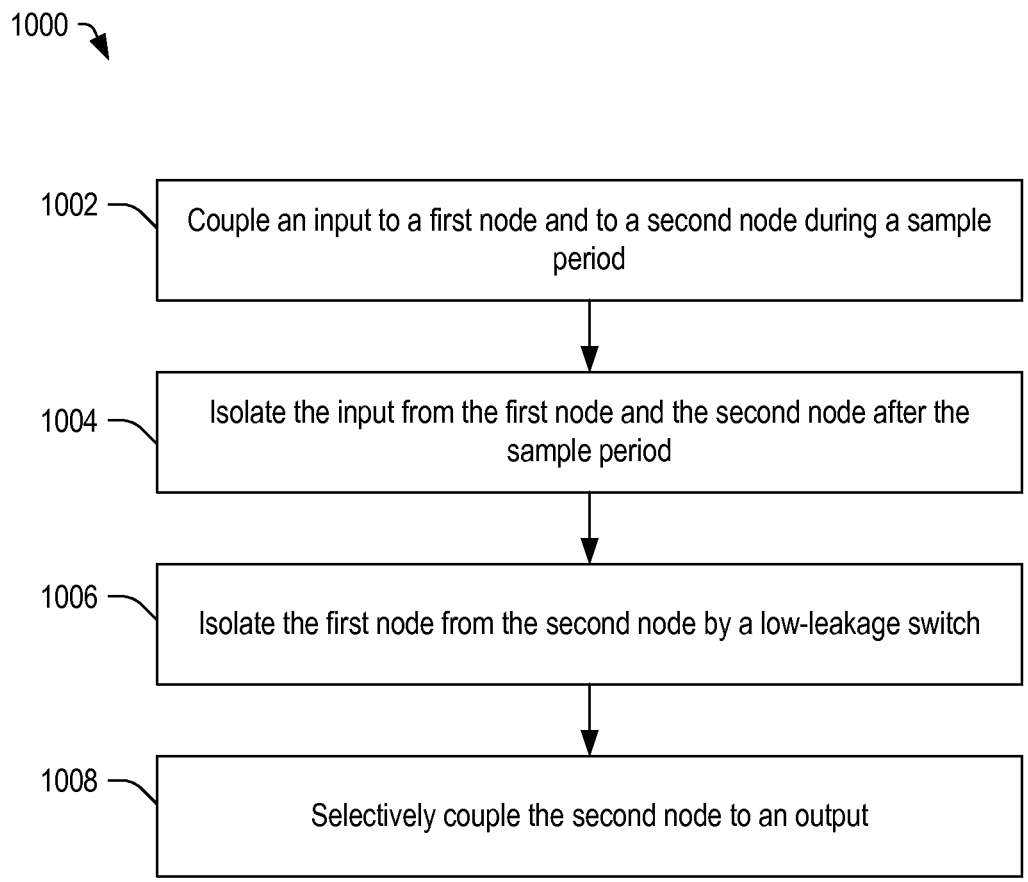
FIG. 10 is a method of isolating a node of a sample and hold circuit according to certain embodiments.

FIG. 10 is a method 1000 of isolating a node of a sample and hold circuit according to certain embodiments. The method 1000 may include coupling an input to a first node and to a second node during a sample phase, at 1002. In certain embodiments, the first node and the second node may be coupled to an input signal through a plurality of switches. Further, in certain embodiments, the second node may be coupled to at least one capacitor, and the first node may be coupled to at least one of a capacitor and a buffer circuit, such as an amplifier output.

The method 1000 may further include isolating the input from the first node and the second node after the sample phase, at 1004. The nodes may be isolated by opening the switches or biasing transistors to decouple the nodes from the input. The method 1000 may further include isolating the first node from the second node by a low-leakage switch, at 1006. In certain embodiments, one or more of the switches may be implemented using a MOSFET device that has a drain, a gate, a source, and bulk material coupled to the source or having an injected charge to reduce leakage.

The method 1000 may also include selectively coupling the second node to an output, at 1008. In certain embodiments, the second node may be coupled to the output through a switch, through other intervening circuit components, or any combination thereof. In certain embodiments, additional switches and sampling nodes may be included and switch timing may be varied to selectively chop sampled versions of the input signal to compensate for component mismatch errors.

In conjunction with the circuits and methods described above with respect to FIGS. 1-10, embodiments of circuits may perform useful functions at chip current levels of microamperes or less. In certain embodiments, the circuits may employ one or more topologies that lower switch leakage leading to lower average current consumption and capacitor area. A lower leakage topology allows for longer periods between voltage refresh operations, which may consume high levels of current, especially in finer line process technology nodes (such as 90 nm and lower). Further, while the discussion above is directed to MOSFET implementations, it should be appreciated that the circuits and methods described above may, in certain embodiments, be implemented using bipolar junction transistors.

Although the present invention has been described with reference to preferred embodiments, workers skilled in the art will recognize that changes may be made in form and detail without departing from the scope of the invention.

What is claimed is:

1. A circuit comprising:
    a first sample node configured to provide a low precision sample of an input signal;
    a second sample node configured to store a high precision sample of the input signal;
    a capacitor coupled between the second sample node and a power supply;
    a buffer circuit including a first input coupled to the second sample node, a second input, and an output coupled to the first sample node and to the second input;
    a first switch circuit coupled between an input and the first sample node; and
    a second switch circuit including bulk material contact area, a first node coupled to the first sample node, a control node responsive to a control signal, and a second node coupled to the second sample node, the bulk material contact area configured to receive a voltage signal from the first node, the voltage signal configured to reduce current leakage between bulk material and at least one of the first node and the second node during a hold phase.

2. The circuit of claim 1, wherein the bulk material contact area is coupled to the first node to receive the voltage signal.

3. The circuit of claim 1, wherein, during a sample phase, the first switch circuit is configured to selectively couple the first node to the input and the second switch circuit is configured to selectively couple the first node to the second node.

4. The circuit of claim 1, wherein the second switch circuit comprises:
    a first transistor including a source coupled to the first node, a gate configured to receive the control signal, and a drain coupled to the second node; and
    a second transistor including a source coupled to the first node, a gate configured to receive the control signal, and a drain coupled to the second node.

5. The circuit of claim 1, wherein the first switch circuit comprises:
    a first transistor including a source coupled to the input, a gate configured to receive the control signal, and a drain coupled to the first node; and
    a second transistor including a source coupled to the input, a gate configured to receive the control signal, and a drain coupled to the first node.

6. The circuit of claim 1, further comprising a bias circuit including:
    a current source coupled to the input to provide a hold current; and
    a diode circuit coupled between the input and a negative supply or ground to convert the hold current to a voltage at the input, the voltage having a voltage level that is approximately equal to a threshold voltage of a diode above a voltage level of the negative supply or ground.

7. The circuit of claim 1, wherein the buffer circuit comprises a differential amplifier.

8. The circuit of claim 1, further comprising:
    a first capacitor coupled between the second sample node and a power supply terminal; and
    a second capacitor coupled between the first sample node and the power supply terminal.

9. The circuit of claim 1, further comprising:
    an output stage having a first input, a second input, and an output;
    a first signal path including a first sample and hold circuit configured to selectively couple to the first input of the output stage;

a second signal path to selectively provide a signal to the second input of the output stage; and wherein the second switch circuit is configured to selectively couple the voltage received at the first node to one of the first input and the second input of the output stage to perform a chop operation.

10. A circuit comprising:

a first node to provide a first sampled voltage;

a second node to store a second sampled voltage having a higher precision than the first sampled voltage;

a capacitor coupled between the second node and a power supply;

a buffer circuit including a first input coupled to the second node, a second input, and an output coupled to the first node and to the second input;

a first switch circuit coupled between an input and the first node; and a second switch circuit coupled between the first node and the second node, the second switch circuit including at least one transistor including a drain coupled to the second node, a source coupled to the first node, a gate responsive to a control signal, and a bulk material contact location configured to receive a signal from the first node.

11. The circuit of claim 10, wherein the bulk material contact location is coupled to the first node.

12. The circuit of claim 10, wherein, during a sample phase, the first switch circuit is configured to selectively couple the first node to the input and the second switch circuit is configured to selectively couple the first node to the second node.

13. The circuit of claim 10, wherein the bulk material contact area provides reduced current leakage between bulk material and at least one of the first node and the second node, during a hold phase, in response to the signal.

14. The circuit of claim 10, further comprising:

an output stage having a first input, a second input, and an output;

a first signal path including a first sample and hold circuit configured to selectively couple to the first input of the output stage;

a second signal path including a second sample and hold circuit configured to selectively couple to the second input of the output stage; and wherein the second switch circuit is configured to selectively couple the voltage received at the first node to one of the first input and the second input of the output stage to perform a chop operation.

15. The circuit of claim 10, wherein the buffer circuit comprises a differential amplifier.

16. The circuit of claim 1, wherein the buffer circuit comprises an amplifier.

* * * * *